United States Patent
Wang et al.

(10) Patent No.: US 11,715,532 B1
(45) Date of Patent: Aug. 1, 2023

(54) RISK ASSESSMENT METHOD BASED ON DATA PRIORITY, MEMORY STORAGE DEVICE, AND MEMORY CONTROL CIRCUIT UNIT

(71) Applicant: Hefei Core Storage Electronic Limited, Anhui (CN)

(72) Inventors: Chih-Ling Wang, Anhui (CN); Yue Hu, Anhui (CN); Qin Qin Tao, Anhui (CN); Dong Sheng Rao, Anhui (CN); Shao Feng Yang, Anhui (CN); Yang Chen, Anhui (CN)

(73) Assignee: Hefei Core Storage Electronic Limited, Anhui (CN)

( * ) Notice: Subject to any disclaimer, the term of this patent is extended or adjusted under 35 U.S.C. 154(b) by 0 days.

(21) Appl. No.: 17/833,901

(22) Filed: Jun. 7, 2022

(30) Foreign Application Priority Data

May 12, 2022 (CN) .......................... 202210513129.7

(51) Int. Cl.
G11C 29/00 (2006.01)
G11C 16/34 (2006.01)
G06F 12/14 (2006.01)

(52) U.S. Cl.
CPC ...... *G11C 16/3422* (2013.01); *G06F 12/1433* (2013.01); *G11C 16/3431* (2013.01); *G11C 29/00* (2013.01)

(58) Field of Classification Search
CPC ... G11C 16/3422; G11C 6/3431; G11C 29/00; G06F 12/1433
USPC .................................................. 365/189.011
See application file for complete search history.

(56) References Cited

U.S. PATENT DOCUMENTS

2015/0347039 A1\* 12/2015 Truong .............. G11C 13/0035
711/103
2016/0224267 A1\* 8/2016 Yang ..................... G11C 29/76

FOREIGN PATENT DOCUMENTS

| CN | 109426622 | 3/2019 |
| CN | 111508532 | 8/2020 |
| CN | 113179665 | 7/2021 |
| CN | 114077393 | 2/2022 |

OTHER PUBLICATIONS

"Office Action of Taiwan Counterpart Application", dated Feb. 20, 2023, p. 1-p. 8.

\* cited by examiner

*Primary Examiner* — Ly D Pham
(74) *Attorney, Agent, or Firm* — JCIPRNET

(57) ABSTRACT

A risk assessment method based on data priority, a memory storage device, and a memory control circuit unit are provided. The method includes: receiving a query command from a host system; in response to the query command, performing a data health detection on a rewritable non-volatile memory module, wherein the rewritable non-volatile memory module stores data with multiple data priorities; generating risk assessment information according to a detection result, wherein the risk assessment information reflects a health degree of data with different data priorities in the rewritable non-volatile memory modules by different risk levels; and transmitting the risk assessment information to the host system.

18 Claims, 7 Drawing Sheets

RISK ASSESSMENT METHOD BASED ON DATA PRIORITY, MEMORY STORAGE DEVICE, AND MEMORY CONTROL CIRCUIT UNIT

CROSS-REFERENCE TO RELATED APPLICATION

This application claims the priority benefit of China application serial no. 202210513129.7, filed on May 12, 2022. The entirety of the above-mentioned patent application is hereby incorporated by reference herein and made a part of this specification.

BACKGROUND

Technical Field

The disclosure relates to a risk assessment technology, and in particular to a risk assessment method based on data priority, a memory storage device, and a memory control circuit unit.

Description of Related Art

Smartphones, tablet computers, and personal computers have grown rapidly over the past few years, resulting in a rapid increase in consumer demand for storage media. Since the rewritable non-volatile memory module (for example, a flash memory) has characteristics such as non-volatile data, power saving, small size, and no mechanical structure, the rewritable non-volatile memory module is very suitable to be built in various portable multimedia devices exemplified above.

The health of the rewritable non-volatile memory module gradually decreases as the usage time increases. Generally speaking, the health and/or the usage life of the rewritable non-volatile memory module may be assessed through counting the erase count, the program count, and the bit error rate of memory cells in the rewritable non-volatile memory module. However, the above evaluation manners cannot accurately reflect the risk levels corresponding to the health of data of different types (for example, different importance) in the rewritable non-volatile memory module.

SUMMARY

The disclosure provides a risk assessment method based on data priority, a memory storage device, and a memory control circuit unit, which can improve the risk assessment efficiency of a rewritable non-volatile memory module.

An exemplary embodiment of the disclosure provides a risk assessment method based on data priority, which is used for a rewritable non-volatile memory module. The risk assessment method includes the following steps. A query command is received from a host system. In response to the query command, a data health detection is performed on the rewritable non-volatile memory module. The rewritable non-volatile memory module stores data with multiple data priorities. Risk assessment information is generated according to a detection result. The risk assessment information reflects a health degree of data with different data priorities in the rewritable non-volatile memory module by different risk levels. The risk assessment information is transmitted to the host system.

An exemplary embodiment of the disclosure further provides a memory storage device, which includes a connection interface unit, a rewritable non-volatile memory module, and a memory control circuit unit. The connection interface unit is used to couple to a host system. The rewritable non-volatile memory module stores data with multiple data priorities. The memory control circuit unit is coupled to the connection interface unit and the rewritable non-volatile memory module. The memory control circuit unit is used to perform the following. A query command is received from the host system. In response to the query command, a data health detection is performed on the rewritable non-volatile memory module. Risk assessment information is generated according to a detection result. The risk assessment information reflects a health degree of data with different data priorities in the rewritable non-volatile memory module by different risk levels. The risk assessment information is transmitted to the host system.

An exemplary embodiment of the disclosure further provides a memory control circuit unit, which is used to control a rewritable non-volatile memory module. The memory control circuit unit includes a host interface, a memory interface, and a memory management circuit. The host interface is used to couple to a host system. The memory interface is used to couple to the rewritable non-volatile memory module. The rewritable non-volatile memory module stores data with multiple data priorities. The memory management circuit is coupled to the host interface and the memory interface. The memory management circuit is used to perform the following. A query command is received from the host system. In response to the query command, a data health detection is performed on the rewritable non-volatile memory module. Risk assessment information is generated according to a detection result. The risk assessment information reflects a health degree of data with different data priorities in the rewritable non-volatile memory module by different risk levels. The risk assessment information is transmitted to the host system.

Based on the above, after receiving the query command from the host system, the data health detection may be performed on the rewritable non-volatile memory module in response to the query command. In particular, the rewritable non-volatile memory module may store the data with multiple data priorities. According to the detection result, the risk assessment information may be automatically generated to reflect the health degree of the data with different data priorities in the rewritable non-volatile memory module by different risk levels. Thereafter, the risk assessment information may be transmitted to the host system. Thereby, the host system can more efficiently perform risk assessment on the rewritable non-volatile memory module.

DETAILED DESCRIPTION OF DISCLOSED EMBODIMENTS

Generally speaking, a memory storage device (also referred to as a memory storage system) includes a rewritable non-volatile memory module and a controller (also referred to as a control circuit). The memory storage device may be used together with a host system, so that the host system may write data into the memory storage device or read data from the memory storage device.

Figure 1:
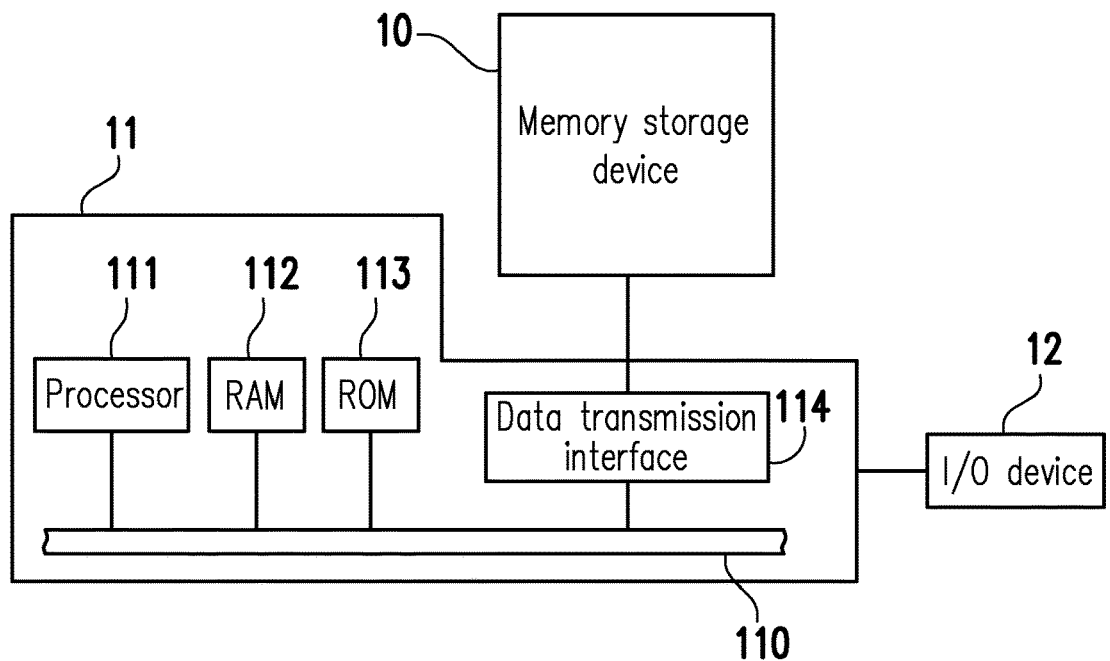
FIG. 1 is a schematic diagram of a host system, a memory storage device, and an input/output (I/O) device according to an exemplary embodiment of the disclosure.
Figure 2:
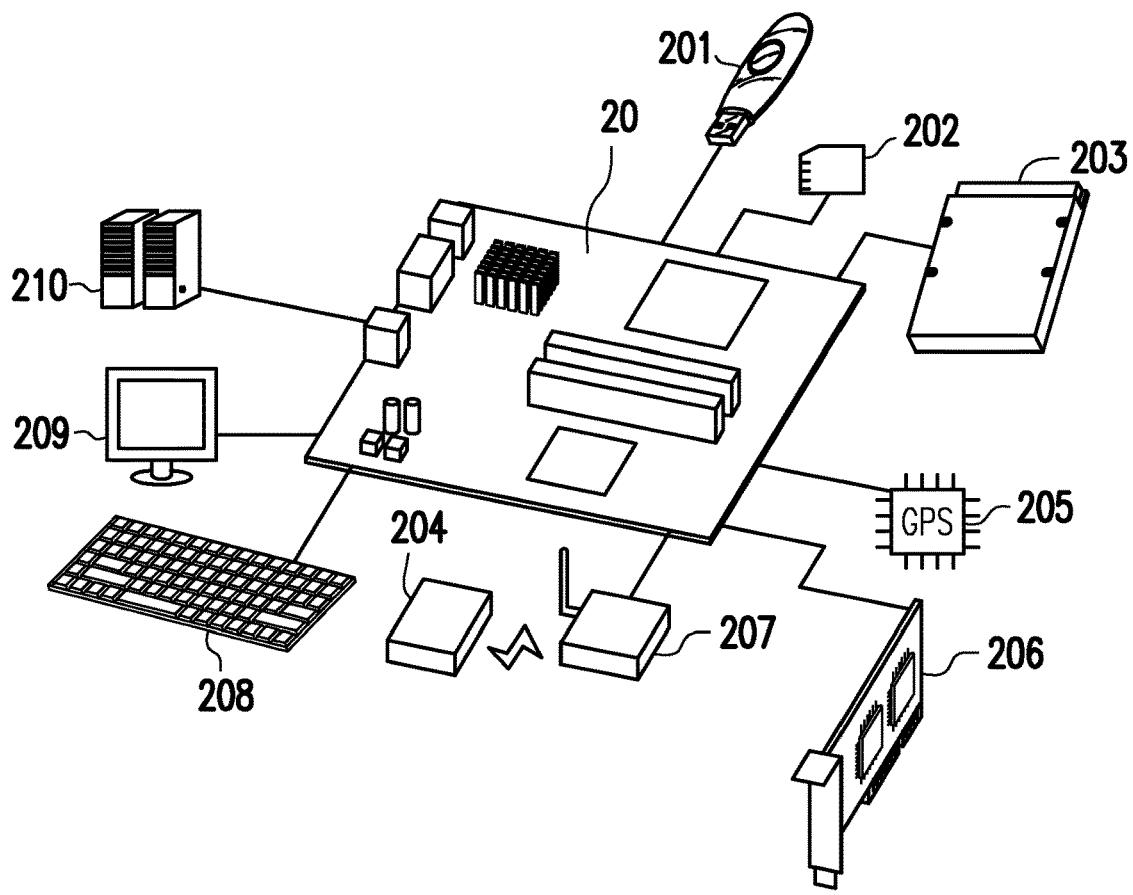
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Please refer to FIG. 1 and FIG. 2. A host system 11 may include a processor 111, a random access memory (RAM) 112, a read only memory (ROM) 113, and a data transmission interface 114. The processor 111, the random access memory 112, the read only memory 113, and the data transmission interface 114 may be coupled to a system bus 110.

In an exemplary embodiment, the host system 11 is coupled to the memory storage device 10 through the data transmission interface 114. For example, the host system 11 may store data to the memory storage device 10 or read data from the memory storage device 10 via the data transmission interface 114. In addition, the host system 11 may be coupled to the I/O device 12 through the system bus 110. For example, the host system 11 may transmit an output signal to the I/O device 12 or receive an input signal from the I/O device 12 via the system bus 110.

In an exemplary embodiment, the processor 111, the random access memory 112, the read only memory 113, and the data transmission interface 114 may be disposed on a motherboard 20 of the host system 11. The number of the data transmission interface 114 may be one or more. Through the data transmission interface 114, the motherboard 20 may be coupled to the memory storage device 10 via a wired or wireless manner.

In an exemplary embodiment, the memory storage device 10 may, for example, be a flash drive 201, a memory card 202, a solid state drive (SSD) 203, or a wireless memory storage device 204. The wireless memory storage device 204 may, for example, be a near field communication (NFC) memory storage device, a wireless fax (WiFi) memory storage device, a Bluetooth memory storage device, a low-power Bluetooth memory storage device (for example, iBeacon), or other memory storage devices based on various wireless communication technologies. In addition, the motherboard 20 may also be coupled to a global positioning system (GPS) module 205, a network interface card 206, a wireless transmission device 207, a keyboard 208, a screen 209, a speaker 210, or various other I/O devices through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with a memory storage device to store data. In an exemplary embodiment, the memory storage device 10 and the host system 11 may respectively include a memory storage device 30 and a host system 31 of FIG. 3.

Figure 3:
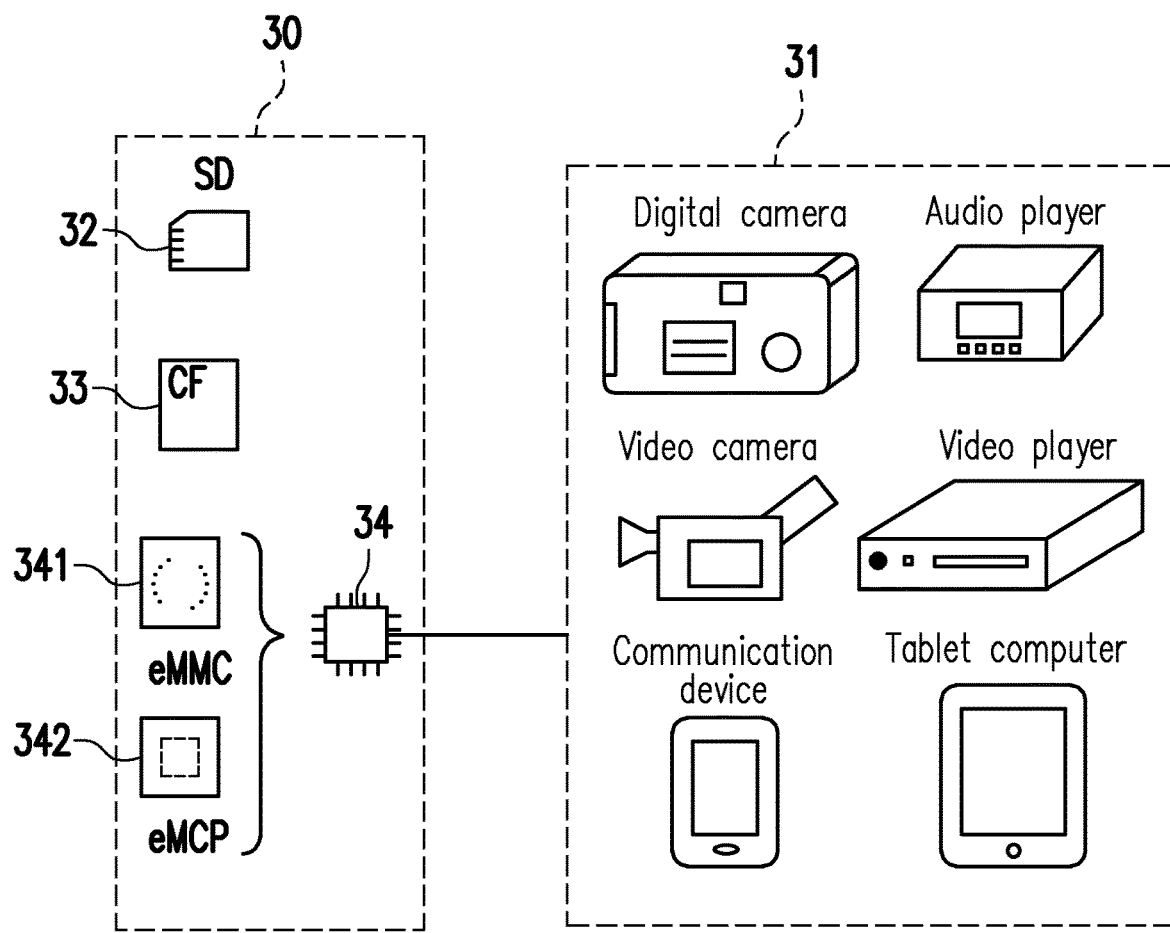
FIG. 3 is a schematic diagram of a host system and a memory storage device according to an exemplary embodiment of the disclosure.

FIG. 3 is a schematic diagram of a host system and a memory storage device according to an exemplary embodiment of the disclosure. Please refer to FIG. 3. The memory storage device 30 may be used together with the host system 31 to store data. For example, the host system 31 may be a system such as a digital camera, a video camera, a communication device, an audio player, a video player, or a tablet computer. For example, the memory storage device 30 may be various non-volatile memory storage devices such as a secure digital (SD) card 32, a compact flash (CF) card 33, or an embedded storage device 34 used by the host system 31. The embedded storage device 34 includes an embedded multi media card (eMMC) 341, an embedded multi chip package (eMCP) storage device 342, and/or various other embedded storage devices in which a memory module is directly coupled onto a substrate of a host system.

Figure 4:
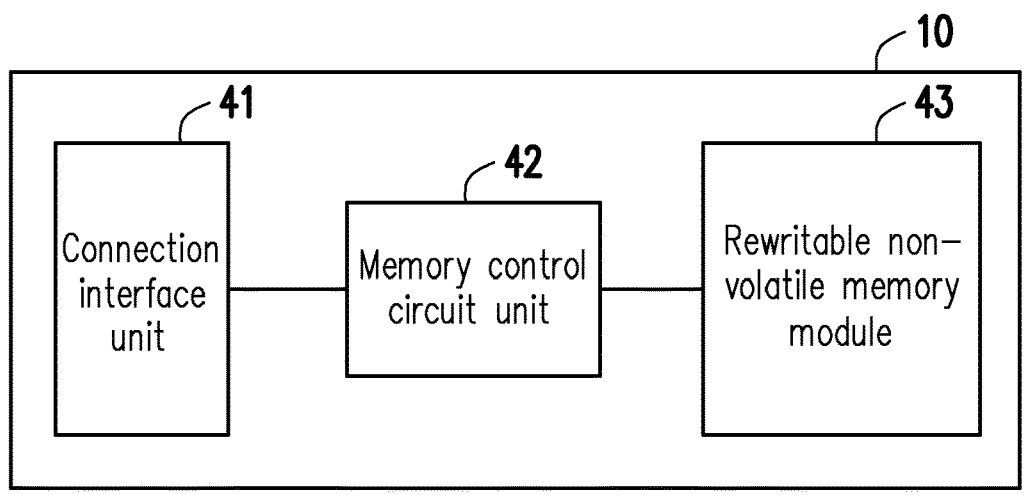
FIG. 4 is a schematic diagram of a memory storage device according to an exemplary embodiment of the disclosure.

FIG. 4 is a schematic diagram of a memory storage device according to an exemplary embodiment of the disclosure. Please refer to FIG. 4. The memory storage device 10 includes a connection interface unit 41, a memory control circuit unit 42, and a rewritable non-volatile memory module 43.

The connection interface unit 41 is used to couple the memory storage device 10 to the host system 11. The memory storage device 10 may communicate with the host system 11 via the connection interface unit 41. In an exemplary embodiment, the connection interface unit 41 is compatible with the peripheral component interconnect express (PCI express) standard. In an exemplary embodiment, the connection interface unit 41 may also conform to the serial advanced technology attachment (SATA) standard, the parallel advanced technology attachment (PATA) standard, the Institute of Electrical and Electronic Engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 may be packaged in one chip with the memory control circuit unit 42, or the connection interface unit 41 may be arranged outside a chip containing the memory control circuit unit 42.

The memory control circuit unit 42 is coupled to the connection interface unit 41 and the rewritable non-volatile memory module 43. The memory control circuit unit 42 is used to perform multiple logic gates or control commands implemented in the form of hardware or the form of firmware and perform operations such as data writing, reading, and erasing in the rewritable non-volatile memory module 43 according to a command of the host system 11.

The rewritable non-volatile memory module 43 is used to store data written by the host system 11. The rewritable non-volatile memory module 43 may include an single level cell (SLC) NAND flash memory module (that is, a flash memory module that may store 1 bit in one memory cell), a multi level cell (MLC) NAND flash memory module (that is, a flash memory module that may store 2 bits in one memory cell), a triple level cell (TLC) NAND flash memory module (that is, a flash memory module that may store 3 bits in one memory cell), a quad level cell (QLC) NAND flash memory module (that is, a flash memory module that may store 4 bits in one memory cell), other flash memory modules, or other memory modules with the same characteristics.

Each memory cell in the rewritable non-volatile memory module 43 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data into the memory cell" or "programming the memory cell". As the threshold voltage changes, each memory cell in the rewritable non-volatile memory module 43 has multiple storage states. Through applying a read voltage, it is possible to judge which storage state a memory cell belongs to, thereby obtaining one or more bits stored in the memory cell.

In an exemplary embodiment, memory cells of the rewritable non-volatile memory module 43 may constitute multiple physical programming units, and the physical programming units may constitute multiple physical erasing units. Specifically, the memory cells on the same word line may form one or more physical programming units. If each memory cell may store more than 2 bits, the physical programming units on the same word line may be classified into at least a lower physical programming unit and an upper physical programming unit. For example, a least significant bit (LSB) of a memory cell belongs to the lower physical programming unit, and a most significant bit (MSB) of a memory cell belongs to the upper physical programming unit. Generally speaking, in the MLC NAND flash memory, the write speed of the lower physical programming unit is greater than the write speed of the upper physical programming unit, and/or the reliability of the lower physical programming unit is higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area contains multiple physical sectors for storing user data, and the redundancy bit area is used to store system data (for example, management data such as an error correcting code). In an exemplary embodiment, the data bit area contains 32 physical sectors, and the size of one physical sector is 512 bytes (B). However, in other exemplary embodiments, the data bit area may also contain 8, 16, more, or less physical sectors, and the size of each physical sector may also be greater or smaller. On the other hand, the physical erasing unit is the smallest unit of erasure. That is, each physical erasing unit contains the smallest number of memory cells to be erased together. For example, the physical erasing unit is a physical block.

Figure 5:
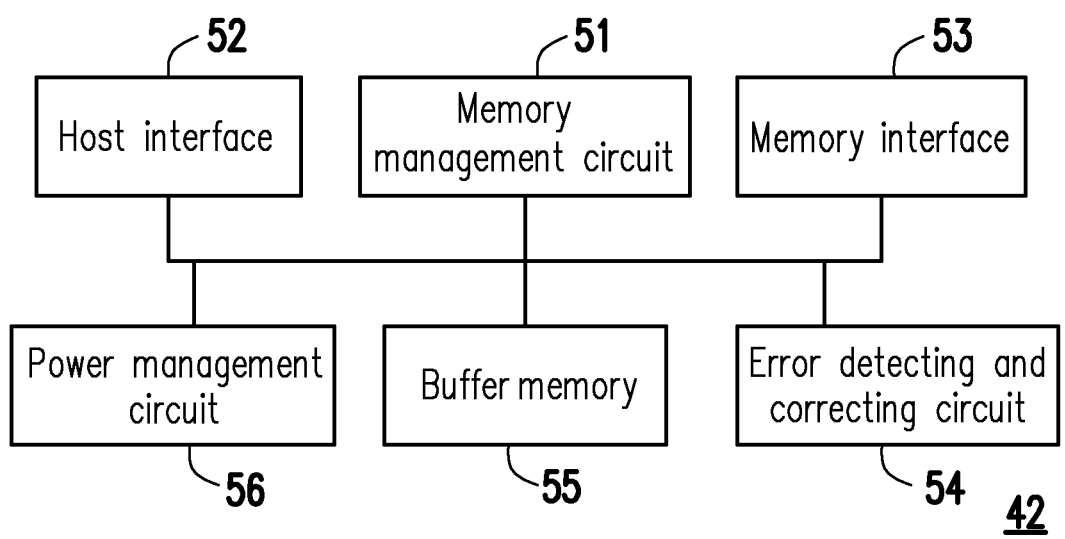
FIG. 5 is a schematic diagram of a memory control circuit unit according to an exemplary embodiment of the disclosure.

FIG. 5 is a schematic diagram of a memory control circuit unit according to an exemplary embodiment of the disclosure. Please refer to FIG. 5. The memory control circuit unit 42 includes a memory management circuit 51, a host interface 52, and a memory interface 53.

The memory management circuit 51 is used to control the overall operation of the memory control circuit unit 42. Specifically, the memory management circuit 51 has multiple control commands, and when the memory storage device 10 is operating, the control commands are performed to perform operations such as data writing, reading, and erasing. The following description of the operation of the memory management circuit 51 is equivalent to the description of the operation of the memory control circuit unit 42.

In an exemplary embodiment, the control commands of the memory management circuit 51 are implemented in the form of firmware. For example, the memory management circuit 51 has a microprocessor unit (not shown) and a read only memory (not shown), and the control commands are burnt into the read only memory. When the memory storage device 10 is operating, the control commands are performed by the microprocessor unit to perform operations such as data writing, reading, and erasing.

In an exemplary embodiment, the control commands of the memory management circuit 51 may also be stored to a specific area (for example, a system area dedicated to storing system data in a memory module) of the rewritable non-volatile memory module 43 in the form of program codes. In addition, the memory management circuit 51 has a microprocessor unit (not shown), a read only memory (not shown), and a random access memory (not shown). In particular, the read only memory has a boot code, and when the memory control circuit unit 42 is enabled, the microprocessor unit first performs the boot code to load the control commands stored in the rewritable non-volatile memory module 43 to the random access memory of the memory management circuit 51. After that, the microprocessor unit runs the control commands to perform operations such as data writing, reading, and erasing.

In an exemplary embodiment, the control commands of the memory management circuit 51 may also be implemented in the form of hardware. For example, the memory management circuit 51 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is used to manage a memory cell or a memory cell group of the rewritable non-volatile memory module 43. The memory write circuit is used to issue a write command sequence to the rewritable non-volatile memory module 43 to write data into the rewritable non-volatile memory module 43. The memory read circuit is used to issue a read command sequence to the rewritable non-volatile memory module 43 to read data from the rewritable non-volatile memory module 43. The memory erase circuit is used to issue an erase command sequence to the rewritable non-volatile memory module 43 to erase data from the rewritable non-volatile memory module 43. The data processing circuit is used to process data to be written into the rewritable non-volatile memory module 43 and data read from the rewritable non-volatile memory module 43. Each of the write command sequence, the read command sequence, and the erase command sequence may include one or more program codes or command codes and be used to instruct the rewritable non-volatile memory module 43 to perform corresponding operations such as writing, reading, and erasing. In an exemplary embodiment, the memory management circuit 51 may also issue other types of command sequences to the rewritable non-volatile memory module 43 to instruct to perform corresponding operations.

The host interface 52 is coupled to the memory management circuit 51. The memory management circuit 51 may communicate with the host system 11 through the host interface 52. The host interface 52 may be used to receive and identify commands and data transmitted by the host system 11. For example, the commands and the data transmitted by the host system 11 may be transmitted to the memory management circuit 51 through the host interface 52. In addition, the memory management circuit 51 may transmit data to the host system 11 through the host interface 52. In the exemplary embodiment, the host interface 52 is compatible with the PCI express standard. However, it must be understood that the disclosure is not limited thereto. The host interface 52 may also be compatible with the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 53 is coupled to the memory management circuit 51 and is used to access the rewritable non-volatile memory module 43. For example, the memory management circuit 51 may access the rewritable non-volatile memory module 43 through the memory interface 53. In other words, the data to be written into the rewritable non-volatile memory module 43 is converted into a format acceptable by the rewritable non-volatile memory module 43 via the memory interface 53. Specifically, if the memory management circuit 51 intends to access the rewritable non-volatile memory module 43, the memory interface 53 will transmit the corresponding command sequence. For example, the command sequences may include the write command sequence instructing to write data, the read command sequence instructing to read data, the erase command sequence instructing to erase data, and corresponding command sequences instructing various memory operations (for example, changing a read voltage level, executing a garbage collection operation, etc.). The command sequences are, for example, generated by the memory management circuit 51 and transmitted to the rewritable non-volatile memory module 43 through the memory interface 53. The command sequences may include one or more signals, or data on a bus. The signals or the data may include command codes or program codes. For example, the read command sequence includes information such as a read recognition code and a memory address.

In an exemplary embodiment, the memory control circuit unit 42 further includes an error detecting and correcting circuit 54, a buffer memory 55, and a power management circuit 56.

The error detecting and correcting circuit 54 is coupled to the memory management circuit 51 and is used to perform error detecting and correcting operations to ensure the correctness of data. Specifically, when the memory management circuit 51 receives a write command from the host system 11, the error detecting and correcting circuit 54 generates a corresponding error correcting code (ECC) and/or error detecting code (EDC) for data corresponding to the write command, and the memory management circuit 51 writes the data corresponding to the write command and the corresponding error correcting code and/or error detecting code into the rewritable non-volatile in memory module 43. After that, when the memory management circuit 51 reads the data from the rewritable non-volatile memory module 43, the error correcting code and/or the error detecting code corresponding to the data is simultaneously read, and the error detecting and correcting circuit 54 performs the error detecting and correcting operations on the read data according to the error correcting code and/or the error detecting code.

The buffer memory 55 is coupled to the memory management circuit 51 and is used to temporarily store data. The power management circuit 56 is coupled to the memory management circuit 51 and is used to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
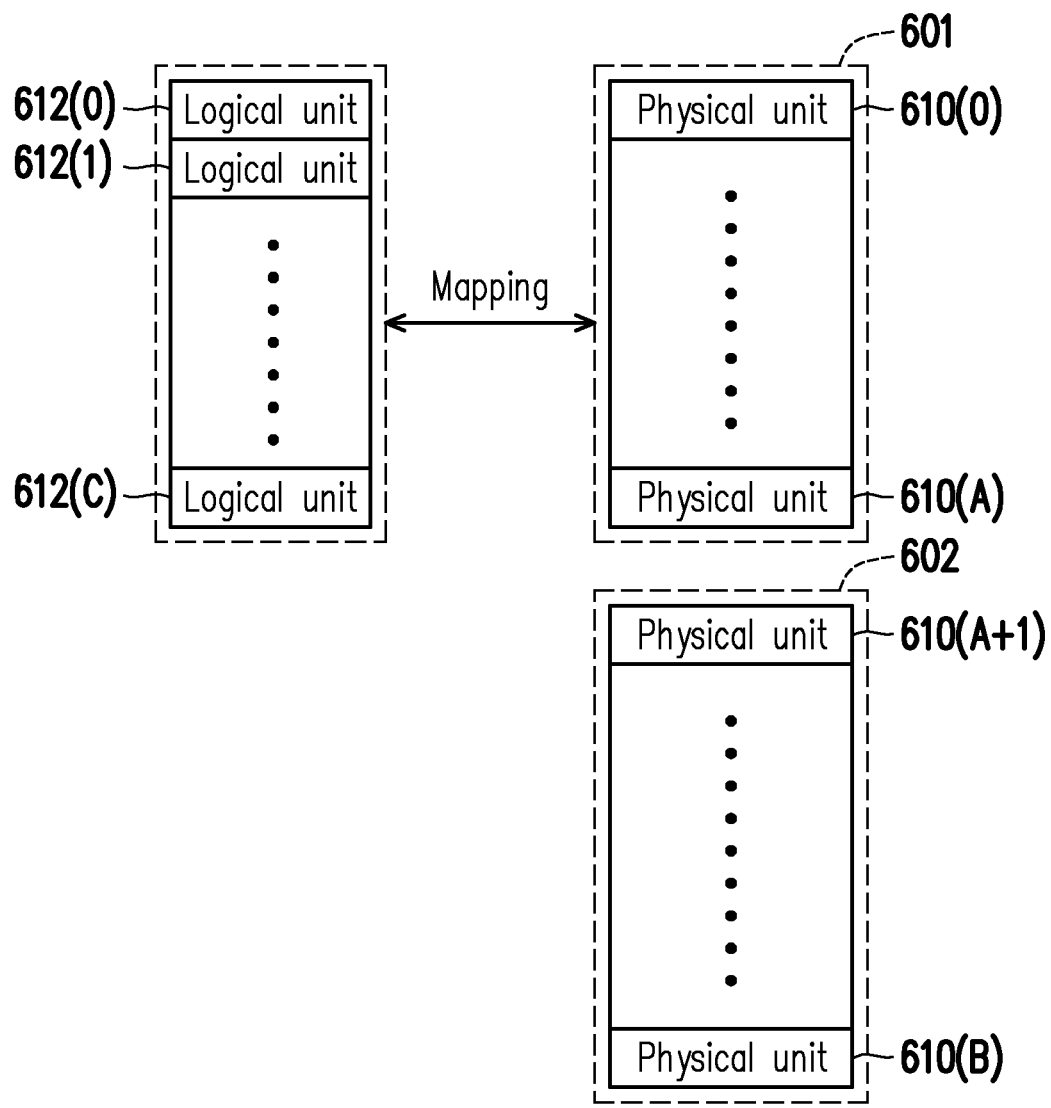
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure. Please refer to FIG. 6. The memory management circuit 51 may logically group physical units 610(0) to 610(B) in the rewritable non-volatile memory module 43 into a storage area 601 and a spare area 602.

In an exemplary embodiment, a physical unit refers to a physical address or a physical programming unit. In an exemplary embodiment, a physical unit may also be composed of multiple continuous or discontinuous physical addresses. In an exemplary embodiment, a physical unit may also refer to a virtual block (VB). A virtual block may include multiple physical addresses or multiple physical programming units.

The physical units 610(0) to 610(A) in the storage area 601 are used to store the user data (for example, the user data from the host system 11 of FIG. 1). For example, the physical units 610(0) to 610(A) in the storage area 601 may store valid data and invalid data. The physical units 610(A+1) to 610(B) in the spare area 602 do not store data (for example, valid data). For example, if a certain physical unit does not store valid data, the physical unit may be associated (or added) to the spare area 602. In addition, the physical units (or the physical units that do not store valid data) in the spare area 602 may be erased. When writing new data, one or more physical units may be extracted from the spare area 602 to store the new data. In an exemplary embodiment, the spare area 602 is also referred to as a free pool.

The memory management circuit 51 may be configured with logical units 612(0) to 612(C) to map the physical units 610(0) to 610(A) in the storage area 601. In an exemplary embodiment, each logical unit corresponds to one logical address. For example, a logical address may include one or more logical block addresses (LBA) or other logical management units. In an exemplary embodiment, a logical unit may also correspond to one logical programming unit or consist of multiple continuous or discontinuous logical addresses.

It should be noted that one logical unit may be mapped to one or more physical units. If a certain physical unit is currently mapped by a certain logical unit, it means that data currently stored in the physical unit includes valid data. Conversely, if a certain physical unit is not currently mapped by any logical unit, it means that data currently stored in the physical unit is invalid data.

The memory management circuit 51 may record management data (also referred to as logical-to-physical mapping information) describing a mapping relationship between the logical unit and the physical unit in at least one logical-to-physical mapping table. When the host system 11 intends to read data from the memory storage device 10 or write data into the memory storage device 10, the memory management circuit 51 may access the rewritable non-volatile memory module 43 according to information in the logical-to-physical mapping table.

The rewritable non-volatile memory module 43 may be used to store data with multiple data priorities. A data priority of certain data reflects the importance of the data. For example, the data priority of the certain data may be positively correlated with the importance of the data. That is, if the data priority of the certain data is higher, it means that the importance of the data is higher. For example, different types of data may have different data priorities. Alternatively, data for different purposes may have different data priorities. Alternatively, data recorded in different management tables may also have different data priorities. Alternatively, data stored in different data storage areas in the rewritable non-volatile memory module 43 may also have different data priorities. In addition, more conditions may also be used to distinguish data with different data priorities in the rewritable non-volatile memory module 43, which is not limited in the disclosure.

The memory management circuit 51 may receive a query command from the host system 11. The query command may be used to query a health degree or a risk level of the memory storage device 10 or the rewritable non-volatile memory module 43. In response to the query command, the memory management circuit 51 may perform a risk detection (also referred to as a data health detection) on the rewritable non-volatile memory module 43. The memory management circuit 51 may generate assessment information (also referred to as risk assessment information) according to a detection result of the data health detection. In particular, the risk assessment information may reflect a health degree of the data with different data priorities in the rewritable non-volatile memory module 43 by different risk levels. Then, the memory management circuit 51 may transmit the risk assessment information to the host system 11.

Figure 7:
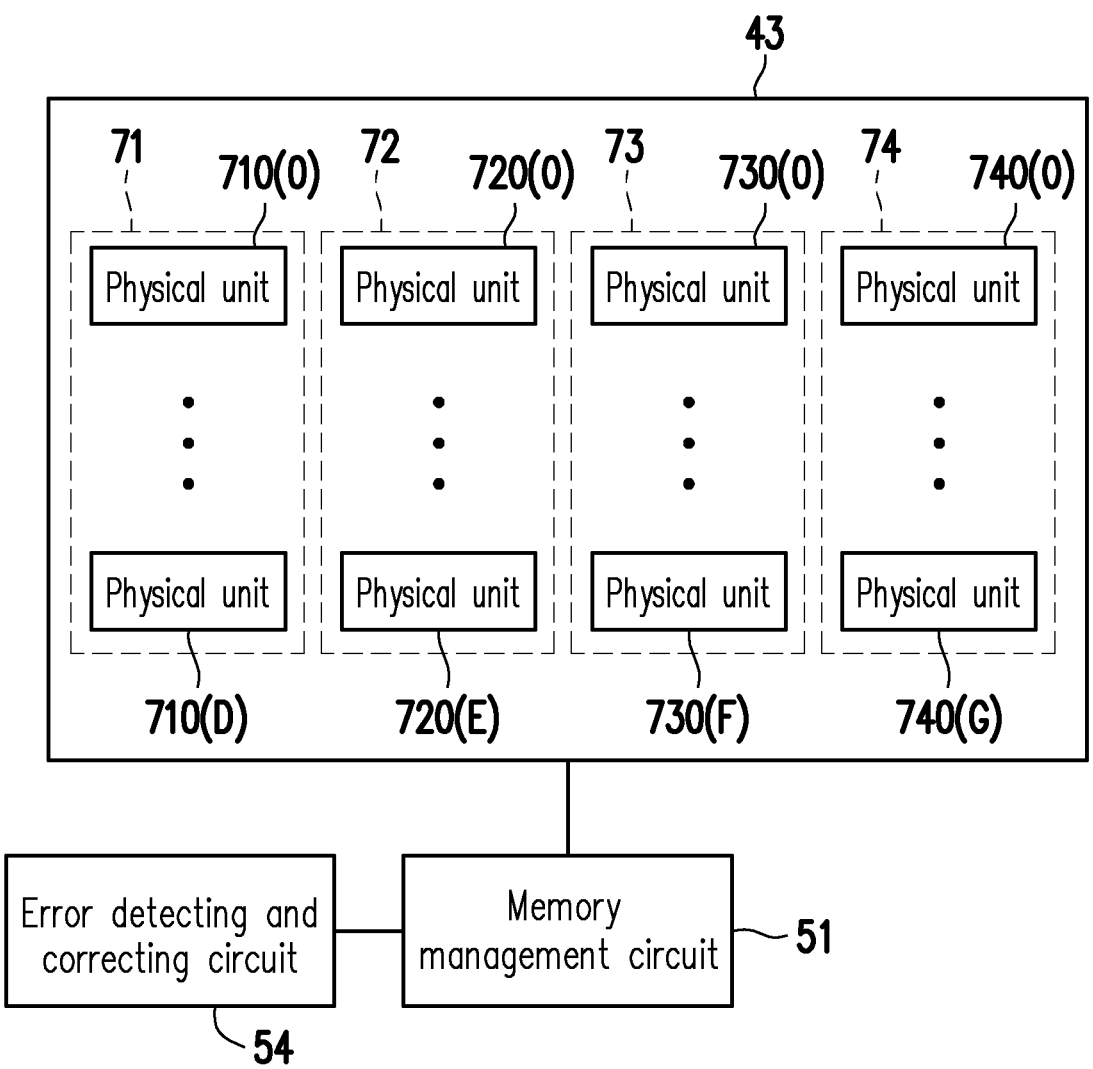
FIG. 7 is a schematic diagram of multiple data storage areas in a rewritable non-volatile memory module according to an exemplary embodiment of the disclosure.

FIG. 7 is a schematic diagram of multiple data storage areas in a rewritable non-volatile memory module according to an exemplary embodiment of the disclosure. Please refer to FIG. 7. In an exemplary embodiment, the rewritable non-volatile memory module 43 includes data storage areas 71 to 74. For example, the data storage area 71 includes physical units 710(0) to 710(D), the data storage area 72 includes physical units 720(0) to 720(E), the data storage area 73 includes physical units 730(0) to 730(F), and the data storage area 74 includes physical units 740(0) to 740(G). The data storage areas 71 to 74 are respectively used to store data with specific data priorities. For example, a certain data storage area (also referred to as a first data storage area) among the data storage areas 71 to 74 is used to store data with a specific data priority (also referred to as a first data priority), another data storage area (also referred to as a second data storage area) among the data storage areas 71 to 74 is used to store data with another data priority (also referred to as a second data priority), and so on, and the first data priority is different from the second data priority.

In an exemplary embodiment, in response to the query command, the memory management circuit 51 may issue a detection command to the rewritable non-volatile memory module 13. The detection command may be used to instruct the rewritable non-volatile memory module 43 to scan the data storage areas 71 to 74. For example, during the process of scanning the data storage areas 71 to 74, the rewritable non-volatile memory module 43 may read data from the data storage areas 71 to 74 and return the read data to the memory management circuit 51. The memory management circuit 51 may decode the read data through the error detecting and correcting circuit 54. If certain data may be successfully decoded, the memory management circuit 51 may judge that the data is healthy. Alternatively, if certain data cannot be successfully decoded, the memory management circuit 51 may judge that the data is corrupted. According to a scanning result, the memory management circuit 51 may obtain the health degree of the data with different data priorities in the rewritable non-volatile memory module 43 and generate corresponding risk assessment information.

In an exemplary embodiment, according to data with a specific data priority in the rewritable non-volatile memory module 43 being corrupted, the memory management circuit 51 may provide risk assessment information with a specific risk level. Alternatively, from another perspective, according to the data with different data priorities in the rewritable non-volatile memory module 43 being corrupted, the memory management circuit 51 may provide risk assessment information with different risk levels.

For example, in response to the data with the first data priority in the rewritable non-volatile memory module 43 being corrupted, the memory management circuit 51 may generate risk assessment information with a specific risk level (also referred to as a first risk level). In addition, in response to the data with the second data priority in the rewritable non-volatile memory module 43 being corrupted, the memory management circuit 51 may generate risk assessment information with another risk level (also referred to as a second risk level). In this way, after transmitting the risk assessment information to the host system 11 to respond to the query command, the host system 11 may perform risk assessment on the memory storage device 10 or the rewritable non-volatile memory module 43 according to the risk assessment information.

In an example embodiment, the risk level is positively correlated with the data priority of the detected corrupted data. That is, assuming that the data priority of the corrupted data in the rewritable non-volatile memory module 43 is higher, the corresponding generated risk assessment information will have a higher risk level. Thereby, the degree of influence of the data corruption on the memory storage device 10 or the rewritable non-volatile memory module 43 can be emphasized.

In an exemplary embodiment, data (also referred to as first data) stored in the data storage area 71 (for example, the physical units 710(0) to 710(D)) may include the most important system data in the rewritable non-volatile memory module 43. For example, the first data may include all or a part of the system data (for example, a firmware code for booting) related to whether the memory storage device 10 or the rewritable non-volatile memory module 43 may operate normally. If the first data is corrupted (for example, the firmware code booting is corrupted), there is a high probability that the memory storage device 10 or the rewritable non-volatile memory module 43 cannot operate normally (for example, cannot be booted normally).

In an exemplary embodiment, data (also referred to as second data) stored in the data storage area 72 (for example, the physical units 720(0) to 720(E)) includes mapping data, which records the mapping relationship between the logical unit and the physical unit. For example, the second data may include the logical-to-physical mapping table. If the second data is corrupted (for example, a part of the logical-tophysical mapping table is lost), the memory storage device 10 may not be able to perform data reading normally.

In an exemplary embodiment, data (also referred to as third data) stored in the data storage area 73 (for example, the physical units 730(0) to 730(F)) may include the system data for a specific system event. For example, the system event may include power on/off, identity verification, etc., and the type of the system event is not limited thereto. If the third data is corrupted (for example, verification information of the identity verification is lost), the memory management circuit 51 may not be able to perform the related system event (for example, an identity verification procedure).

In an exemplary embodiment, data (also referred to as fourth data) stored in the data storage area 74 (for example, the physical units 740(0) to 740(G)) may include management data for managing the user data. For example, the management data may include a valid data management table, etc. for managing valid data in at least part of the physical units, and the type of the management data is not limited thereto. The valid data management table may be used to record distribution information of the valid data in the physical units. If the fourth data is corrupted (for example, the valid data management table is lost), the reading of the affected user data may be affected (for example, the reading speed is reduced or a reading abnormality occurs), but the normal operation of the memory storage device 10 or the rewritable non-volatile memory module 43 is not affected as a whole.

In an exemplary embodiment, among the first data to the fourth data, the data priority of the first data is the highest, the data priority of the second data is lower than the data priority of the first data, the data priority of the third data is lower than the data priority of the second data, and the data priority of the fourth data is the lowest. Therefore, when the scanning result shows that the first data is corrupted, the generated risk assessment information may have the highest risk level to inform the host system 11 that a serious abnormality that affects the normal operation of the memory storage device 10 or the rewritable non-volatile memory module 43 may occur at any time in the future. In addition, when the scanning result shows that the second data, the third data, or the fourth data is corrupted, the generated risk assessment information may have the next highest, the next lowest, or the lowest risk level to reflect the current health degree of the memory storage device 10 or the rewritable non-volatile memory module 43.

In an exemplary embodiment, if it is detected that multiple data with multiple data priorities are abnormal (for example, corrupted) at the same time, the memory management circuit 51 may generate the risk assessment information according to abnormal data with a higher data priority among the abnormal data. For example, it is assumed that the detection result reflects that the first data and the second data in the rewritable non-volatile memory module 43 are both corrupted, and the data priority of the first data is higher than the data priority of the second data. In response to the detection result, the memory management circuit 51 may generate the risk assessment information with the highest risk level to reflect that the first data with the highest data priority is corrupted. Alternatively, it is assumed that the detection result reflects that the second data and the third data in the rewritable non-volatile memory module 43 are both corrupted, and the data priority of the second data is higher than the data priority of the third data. In response to the detection result, the memory management circuit 51 may generate the risk assessment information with the next highest risk level to reflect that the second data with the next highest data priority is corrupted.

It should be noted that the foregoing exemplary embodiments are all exemplified by the four data storage areas 71 to 74 in the rewritable non-volatile memory module 43 respectively storing four different types of data (that is, data with four different data priorities), but the disclosure is not limited thereto. In an exemplary embodiment, the total number of the data storage areas 71 to 74 and the type of the data may be more or less to meet practical requirements.

Figure 8:
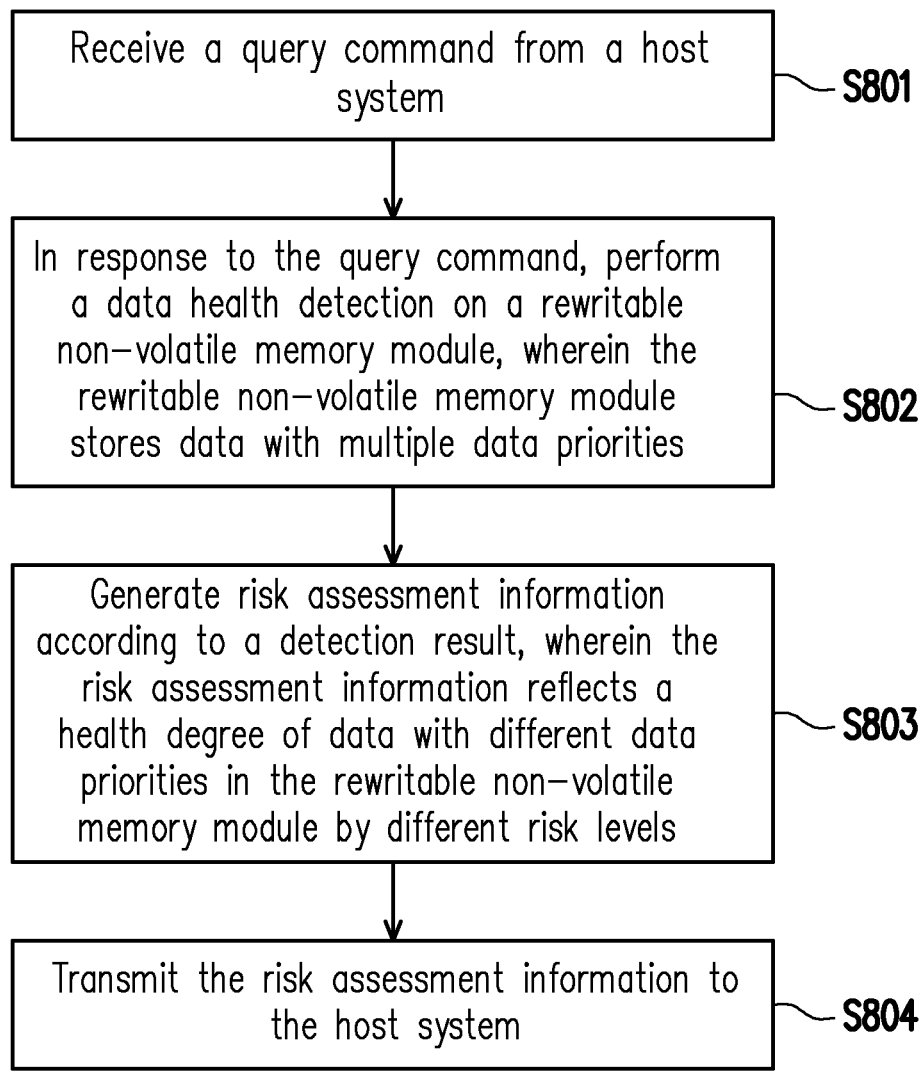
FIG. 8 is a flowchart of a risk assessment method according to an exemplary embodiment of the disclosure.

FIG. 8 is a flowchart of a risk assessment method according to an exemplary embodiment of the disclosure. Please refer to FIG. 8. In Step S801, a query command is received from a host system. In Step S802, in response to the query command, a data health detection is performed on a rewritable non-volatile memory module, wherein the rewritable non-volatile memory module stores data with multiple data priorities. In Step S803, risk assessment information is generated according to a detection result, wherein the risk assessment information reflects a health degree of data with different data priorities in the rewritable non-volatile memory module by different risk levels. In Step S804, the risk assessment information is transmitted to the host system.

Figure 9:
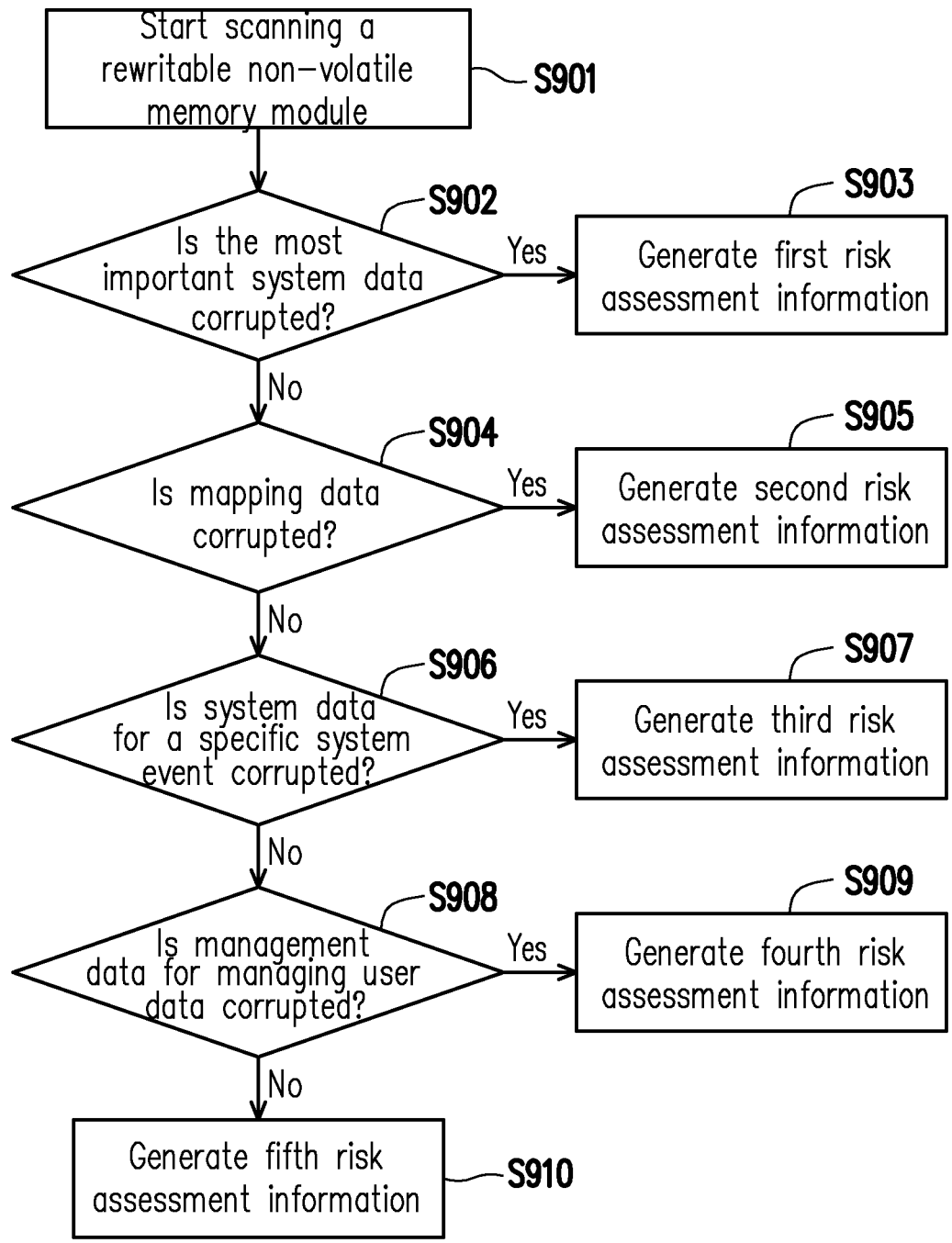
FIG. 9 is a flowchart of a risk assessment method according to an exemplary embodiment of the disclosure.

FIG. 9 is a flowchart of a risk assessment method according to an exemplary embodiment of the disclosure. Please refer to FIG. 9. In Step S901, in response to a query command, scanning of a rewritable non-volatile memory module starts. In Step S902, it is judged whether the most important system data (that is, the first data) in the rewritable non-volatile memory module is corrupted. If yes, in Step S903, the risk assessment information with the highest risk level (also referred to as first risk assessment information) is generated. If not, proceed to Step S904.

In Step S904, it is judged whether the mapping data (that is, the second data) in the rewritable non-volatile memory module is corrupted. If yes, in Step S905, the risk assessment information with the next highest risk level (also referred to as second risk assessment information) is generated. If not, proceed to Step S906.

In Step S906, it is judged whether the system data (that is, the third data) for a specific system event in the rewritable non-volatile memory module is corrupted. If yes, in Step S907, the risk assessment information with the next lowest risk level (also referred to as third risk assessment information) is generated. If not, proceed to Step S908.

In Step S908, it is judged whether the management data (that is, the fourth data) for managing the user data in the rewritable non-volatile memory module is corrupted. If yes, in Step S909, the risk assessment information with the lowest risk level (also referred to as fourth risk assessment information) is generated. If not, in Step S910, risk assessment information (also referred to as fifth risk assessment information) indicating no obvious risk (or no known risk) is generated.

However, each step in FIG. 8 and FIG. 9 has been described in detail as above and will not be repeated here. It should be noted that each step in FIG. 8 and FIG. 9 may be implemented as multiple program codes or circuits, which is not limited in the disclosure. In addition, the methods of FIG. 8 and FIG. 9 may be used in conjunction with the foregoing exemplary embodiments and may also be used alone, which is not limited in the disclosure.

In summary, after performing the data health detection, the memory storage device may automatically generate the risk assessment information with a specific risk level based on the data priority of the abnormal data (for example, the corrupted data). According to the risk assessment information, the host system can more efficiently perform risk assessment on the memory storage device or the rewritable non-volatile memory module.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A risk assessment method based on data priority, used for a rewritable non-volatile memory module, the risk assessment method comprising:
    receiving a query command from a host system;
    in response to the query command, performing a data health detection on the rewritable non-volatile memory module, wherein the rewritable non-volatile memory module stores data with a plurality of data priorities;
    generating risk assessment information according to a detection result, wherein the risk assessment information reflects a health degree of data with different data priorities in the rewritable non-volatile memory module by different risk levels; and
    transmitting the risk assessment information to the host system.

2. The risk assessment method according to claim 1, wherein the rewritable non-volatile memory module comprises a plurality of data storage areas, a first data storage area among the data storage areas is used to store data with a first data priority, a second data storage area among the data storage areas is used to store data with a second data priority, and the first data priority is different from the second data priority.

3. The risk assessment method according to claim 2, wherein the step of performing the data health detection on the rewritable non-volatile memory module comprises:
    issuing a detection command to the rewritable non-volatile memory module to instruct the rewritable non-volatile memory module to scan the data storage areas; and
    obtaining the health degree of the data with the different data priorities in the rewritable non-volatile memory module according to a scanning result.

4. The risk assessment method according to claim 1, wherein the step of generating the risk assessment information according to the detection result comprises:
    in response to data with a first data priority in the rewritable non-volatile memory module being corrupted, generating risk assessment information with a first risk level; and
    in response to data with a second data priority in the rewritable non-volatile memory module being corrupted, generating risk assessment information with a second risk level, wherein the first data priority is different from the second data priority, and the first risk level is different from the second risk level.

5. The risk assessment method according to claim 1, wherein the data with the different data priorities in the rewritable non-volatile memory module comprise first data, second data, third data, and fourth data,
    the first data comprises most important system data,
    the second data comprises mapping data recording a mapping relationship between a logical unit and a physical unit,
    the third data comprises system data for a specific system event, and
    the fourth data comprises management data for managing user data.

6. The risk assessment method according to claim 5, wherein a data priority of the first data is higher than a data priority of the second data, the data priority of the second data is higher than a data priority of the third data, and the data priority of the third data is higher than a data priority of the fourth data.

7. A memory storage device, comprising:
    a connection interface unit, used to couple to a host system;
    a rewritable non-volatile memory module, storing data with a plurality of data priorities; and
    a memory control circuit unit, coupled to the connection interface unit and the rewritable non-volatile memory module,
    wherein the memory control circuit unit is used to:
        receive a query command from the host system;
        in response to the query command, perform a data health detection on the rewritable non-volatile memory module;
        generate risk assessment information according to a detection result, wherein the risk assessment information reflects a health degree of data with different data priorities in the rewritable non-volatile memory module by different risk levels; and
        transmit the risk assessment information to the host system.

8. The memory storage device according to claim 7, wherein the rewritable non-volatile memory module comprises a plurality of data storage areas, a first data storage area among the data storage areas is used to store data with a first data priority, a second data storage area among the data storage areas is used to store data with a second data priority, and the first data priority is different from the second data priority.

9. The memory storage device according to claim 8, wherein the operation of the memory control circuit unit performing the data health detection on the rewritable non-volatile memory module comprises:
    issuing a detection command to the rewritable non-volatile memory module to instruct the rewritable non-volatile memory module to scan the data storage areas; and
    obtaining the health degree of the data with the different data priorities in the rewritable non-volatile memory module according to a scanning result.

10. The memory storage device according to claim 7, wherein the operation of the memory control circuit unit generating the risk assessment information according to the detection result comprises:
    in response to data with a first data priority in the rewritable non-volatile memory module being corrupted, generating risk assessment information with a first risk level; and
    in response to data with a second data priority in the rewritable non-volatile memory module being corrupted, generating risk assessment information with a second risk level, wherein the first data priority is different from the second data priority, and the first risk level is different from the second risk level.

11. The memory storage device according to claim 7, wherein the data with the different data priorities in the rewritable non-volatile memory module comprise first data, second data, third data, and fourth data,
    the first data comprises most important system data, the second data comprises mapping data recording a mapping relationship between a logical unit and a physical unit, the third data comprises system data for a specific system event, and the fourth data comprises management data for managing user data.

12. The memory storage device according to claim 11, wherein a data priority of the first data is higher than a data priority of the second data, the data priority of the second data is higher than a data priority of the third data, and the data priority of the third data is higher than a data priority of the fourth data priority.

13. A memory control circuit unit, used to control a rewritable non-volatile memory module, the memory control circuit unit comprising:

a host interface, used to couple to a host system;

a memory interface, used to couple to the rewritable non-volatile memory module, wherein the rewritable non-volatile memory module stores data with a plurality of data priorities; and a memory management circuit, coupled to the host interface and the memory interface, wherein the memory management circuit is used to:
receive a query command from the host system;
in response to the query command, perform a data health detection on the rewritable non-volatile memory module;
generate risk assessment information according to a detection result, wherein the risk assessment information reflects a health degree of data with different data priorities in the rewritable non-volatile memory module by different risk levels; and
transmit the risk assessment information to the host system.

14. The memory control circuit unit according to claim 13, wherein the rewritable non-volatile memory module comprises a plurality of data storage areas, a first data storage area among the data storage areas is used to store data with a first data priority, a second data storage area among the data storage areas is used to store data with a second data priority, and the first data priority is different from the second data priority.

15. The memory control circuit unit according to claim 13, wherein the operation of the memory management circuit performing the data health detection on the rewritable non-volatile memory module comprises:

issuing a detection command to the rewritable non-volatile memory module to instruct the rewritable non-volatile memory module to scan the data storage areas; and obtaining the health degree of the data with the different data priorities in the rewritable non-volatile memory module according to a scanning result.

16. The memory control circuit unit according to claim 13, wherein the operation of the memory management circuit generating the risk assessment information according to the detection result comprises:

in response to data with a first data priority in the rewritable non-volatile memory module being corrupted, generating risk assessment information with a first risk level; and in response to data with a second data priority in the rewritable non-volatile memory module being corrupted, generating risk assessment information with a second risk level, wherein the first data priority is different from the second data priority, and the first risk level is different from the second risk level.

17. The memory control circuit unit according to claim 13, wherein the data with the different data priorities in the rewritable non-volatile memory module comprise first data, second data, third data, and fourth data, the first data comprises most important system data, the second data comprises mapping data recording a mapping relationship between a logical unit and a physical unit, the third data comprises system data for a specific system event, and the fourth data comprises management data for managing user data.

18. The memory control circuit unit according to claim 17, wherein a data priority of the first data is higher than a data priority of the second data, the data priority of the second data is higher than a data priority of the third data, and the data priority of the third data is higher than a data priority of the fourth data priority.

* * * * *